United States Patent
Ozaki et al.

(10) Patent No.: US 8,204,256 B2
(45) Date of Patent: Jun. 19, 2012

(54) SYSTEM AND METHOD FOR MUTING TV SPEAKERS WHEN HEADPHONES IN USE

(75) Inventors: Arthur Hironari Ozaki, Escondido, CA (US); Peter Shintani, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1290 days.

(21) Appl. No.: 11/699,667

(22) Filed: Jan. 30, 2007

(65) Prior Publication Data

US 2008/0181435 A1    Jul. 31, 2008

(51) Int. Cl.
*H03G 3/00* (2006.01)
(52) U.S. Cl. .......... 381/107; 381/28; 381/102; 381/103; 381/104; 381/105; 381/120; 381/370; 381/381
(58) Field of Classification Search .................. 381/104, 381/107, 370, 381, 28, 102, 103, 105, 120
See application file for complete search history.

(56) References Cited

U.S. PATENT DOCUMENTS

| | | | |
|---|---|---|---|
| 7,616,760 B2 * | 11/2009 | Trip et al. ...................... | 379/430 |
| 2002/0102949 A1 | 8/2002 | Langer ............................ | 455/92 |
| 2003/0073460 A1 | 4/2003 | van Pelt et al. | |
| 2005/0032500 A1 | 2/2005 | Nashif et al. .................. | 455/345 |
| 2005/0201585 A1 * | 9/2005 | Jannard et al. ................ | 381/381 |

FOREIGN PATENT DOCUMENTS

| | | |
|---|---|---|
| EP | 1401148 | 3/2004 |
| GB | 2277422 | 10/1994 |
| JP | 8009474 A2 | 1/1996 |
| WO | WO2006/064535 A1 | 6/2006 |
| WO | WO2006/064800 A1 | 6/2006 |
| WO | 2007/009122 | 1/2007 |

* cited by examiner

*Primary Examiner* — Vivian Chin
*Assistant Examiner* — Paul Kim
(74) *Attorney, Agent, or Firm* — John L. Rogitz

(57) ABSTRACT

An audio source (TV, stereo) detects, through a wireless signal from a headphone or from its cradle, when the headphone has been disengaged from the cradle. In response the audio device automatically mutes or lowers the volume output by its speakers.

17 Claims, 2 Drawing Sheets

US 8,204,256 B2

SYSTEM AND METHOD FOR MUTING TV SPEAKERS WHEN HEADPHONES IN USE

FIELD OF THE INVENTION

The present invention relates generally to systems and methods for muting television speakers when TV headphones are in use.

BACKGROUND OF THE INVENTION

A TV viewer must manually adjust or mute the volume of the TV when donning a wireless headphone device so as not to disturb someone else in the room. The same requirement typically applies to other audio sources such as AV receivers, DVD players, etc. As understood herein, it would be convenient to automatically undertake this step for the viewer.

SUMMARY OF THE INVENTION

A headphone system includes a charging cradle and a headphone removably engageable with the charging cradle to charge a battery in the headphone. The headphone includes left and right speakers which, when placed on the head of a user, are juxtaposed with the user's left and right ears. A wireless transmitter is configured to send, upon a predetermined mode change of the system, a wireless signal to an audio device to cause the audio device to alter (as, e.g., by muting) a volume output by the speakers of the audio device.

The predetermined mode change of the system may be a removal of the headphone from the cradle. To this end a switch can be provided on the cradle for generating a signal indicating headphone engagement and/or headphone disengagement with the cradle. A cradle processor may be provided in the cradle, with the wireless transmitter being configured to receive a signal from the cradle processor to cause the transmitter to send the wireless signal to the audio device. The transmitter may be a radiofrequency transmitter mounted on the cradle or the transmitter may be an infrared transmitter connectable by a wire to the cradle.

Alternatively, the transmitter may be mounted on the headphone. In this implementation a predetermined mode change precipitating volume control of the audio player may be a removal of the headphone from the cradle, and/or a switching off of the headphone by a user. Recognizing that different audio devices may require different volume control signal codes, in one non-limiting implementation the wireless signal can carry at least first and second volume change signals for respective first and second audio devices.

In another aspect, a headphone system includes a headphone in turn including left and right audio speakers configured for placement adjacent the ears of a listener to play an audio stream generated by an audio player. The system also has a cradle that is configured for removably receiving the headphone to charge the battery of the headphone. A wireless transmitter is configured to transmit a volume change signal to the audio player in response to an operational change of the headphone.

In still another aspect, an audio system includes audio player bearing at least one player speaker, a headphone wirelessly receiving audio streams generated by the player, and a wireless transmitter that is automatically caused to communicate a volume change signal to the audio player to cause the audio player to mute the player speaker when the listener removes the headphone from a mount, and/or when the listener switches on the headphone.

In yet another aspect, a computer processor is programmed to receive a signal representing a change in the location and/or energization and/or reception of a portable wireless headphone, and in response to the signal, to control a transmitter to send to an audio player a command to alter the volume of a speaker of the player.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
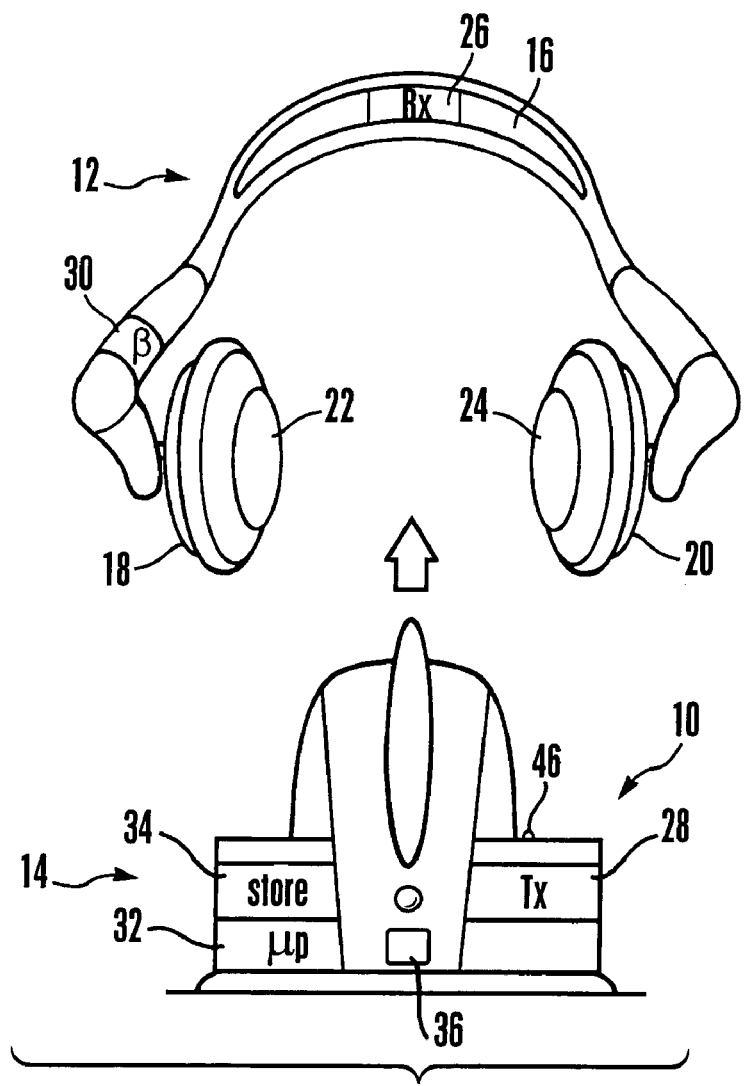
FIG. 1 is a perspective view of a headphone in an exploded relationship with its charging cradle, schematically showing a cradle processor and data store as well as a battery in the headphone.

Referring initially to FIG. 1, a system is shown, generally designated 10, which includes a headphone 12 and a cradle 14 for removably receiving the headphone 12 as shown. The headphone 12 may include a frame 16 configured for placement on a listener's head and left and right speaker pads 18, 20 respectively surrounding left and right speakers 22, 24 which, when placed on the head of the listener, are juxtaposed with the listener's left and right ears. While the non-limiting headphone 12 shown in FIG. 1 has a comparatively rigid frame 16, it is to be understood that in other embodiments the headphone 12 may be configured only with left and right speakers that might not necessarily be mounted on a frame but that nonetheless are placed adjacent the ears of a listener to play an audio stream.

In one embodiment, the headphone 12 is wireless in that a listener can don it and listen to audio streams from an audio player (described further below) without requiring a wired connection to the audio player. The streams may be received wirelessly at a receiver 26 (schematically shown in FIG. 1) on the frame 16 either direct from the audio player or from a device, e.g., the cradle 14, that can be connected by a wire to one or more audio output jacks of the audio player. In the latter case, the cradle 14 can bear an audio stream wireless transmitter 28 as shown in FIG. 1, and the headphone 12 can bear at least one battery 30 for powering the receiver 26 when the headphone 12 is in use.

FIG. 1 further shows that in addition to the audio stream wireless transmitter 28, the cradle 14 can include a cradle processor 32 and an electronic data store 34 accessible to the processor 32. Additionally, a wireless volume control transmitter 36 (which in some implementations may be one and the same with the audio stream wireless transmitter 28) may be mounted on or otherwise connected to the cradle 14 for purposes to be shortly disclosed. The wireless volume control transmitter 36 may transmit using radiofrequency (RF) transmission principles, ultrasonic transmission principles, or other wireless transmission principles including, e.g., infrared (IR). In the latter case, as best shown in FIG. 2 to ensure sufficient signal dispersion the wireless transmitting portion may be implemented by an IR transponder 38 that is connected to a volume control signal generation portion 40 on the cradle 14, with the transponder 38 being distanced from the body of the cradle 14 and connected thereto by a wire 42.

Figure 2:
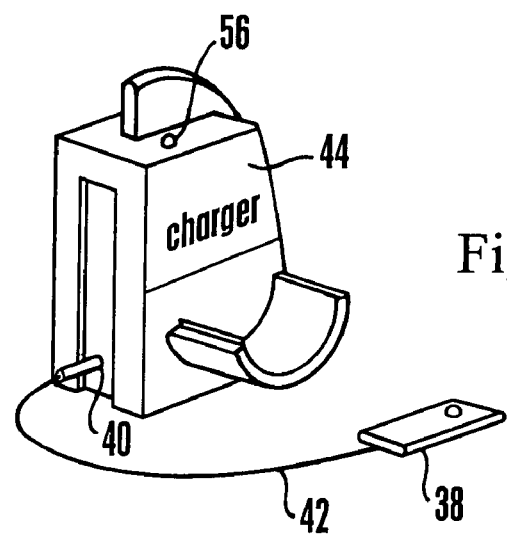
FIG. 2 is a detail view of the cradle with accessory transponder, with portions of the cradle broken away.

In any case, as schematically shown in FIG. 2 the cradle 14 typically includes a battery charging circuit 44. In cross-reference to FIGS. 1 and 2, when the headphone 12 is disposed on the cradle 14, it actuates a switch 46 on the cradle 14. The switch 46 generates a signal indicating that the headphone 12 is engaged with the cradle 14, and in response the cradle processor 32 can cause the charging circuit 44 to charge the battery 30 through an appropriate electrical connection that may be provided in part by the switch 46.

Additionally, in accordance with present principles the signal from the switch 46 (equivalently, the absence thereof) can be used to sense when the headphone 12 is removed from the cradle 14. Since this is typically done when a person wishes to don the headphone 12 and listen to an audio stream from an audio player, the cradle processor 32, in response to removal of the wireless headphone 12 from the cradle 14, not only deactivates the charging circuit 44 but also causes the wireless volume control transmitter 36 to transmit a volume control signal to the audio player 48 (FIG. 3) that communicates audio streams as mentioned above to the headphone system 10 to cause the audio player 48 to mute or lower the volume or otherwise alter the volume output by the speakers 50 of the audio player 48. When the headphone 12 is placed back on the cradle 14 as indicated by the switch 46, the reverse volume control code is sent from the volume control transmitter of the headphone system 10 to the audio player 48 to raise the volume of the player speakers 50.

Figure 3:
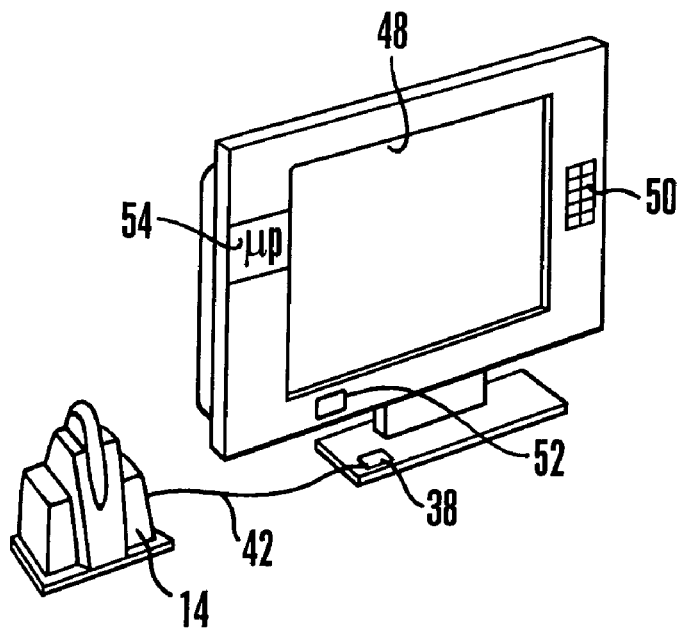
FIG. 3 is a perspective view of an audio device such as a flat panel television (TV) or computer monitor along with the headphone cradle.

Note that in the non-limiting embodiment shown in FIG. 3, IR transmission of the volume control signal is assumed, so that the cradle 14 is shown connected by the wire 42 to the IR transponder 38, which has been positioned in line of sight with a control signal receiver 52 on the audio player 48. In turn, the volume control signal received by the receiver 52 is sent to a player processor 54 for controlling the volume of the speakers 50.

As recognized herein, volume change commands such as mute commands can vary by manufacturer. Accordingly, in one non-limiting embodiment the data store 34 in the cradle 14 can contain preloaded codes of major brands, in groups of codes if desired. When the headphone 12 is removed from the cradle 14 the cradle processor 32 can cause all known mute codes in the storage 34 to be transmitted to ensure that the envisioned volume control of the player speakers 50 is realized regardless of manufacturer.

Alternatively, a setup mode can be entered in which a user toggles through groups of codes and observes which group results in muting of the player speakers 50 to determine the correct code group. In one non-limiting implementation, this selection process can be executed by providing a test button 56 (FIG. 2) on the cradle 14 that can be depressed to select the first group of code, and if the player speakers 50 do not mute, the test button 56 is manipulated again to select the next group of codes, etc. until the player speakers 50 are muted. When the user determines that the "correct" code group has been sent, he can indicate this to the cradle processor by, e.g., rapidly toggling the test button 56 twice in succession.

In some non-limiting implementations the audio player 48 may be an audio-video device such as a television or a personal computer, or it can be an audio-only device such as a music player.

Figure 4:
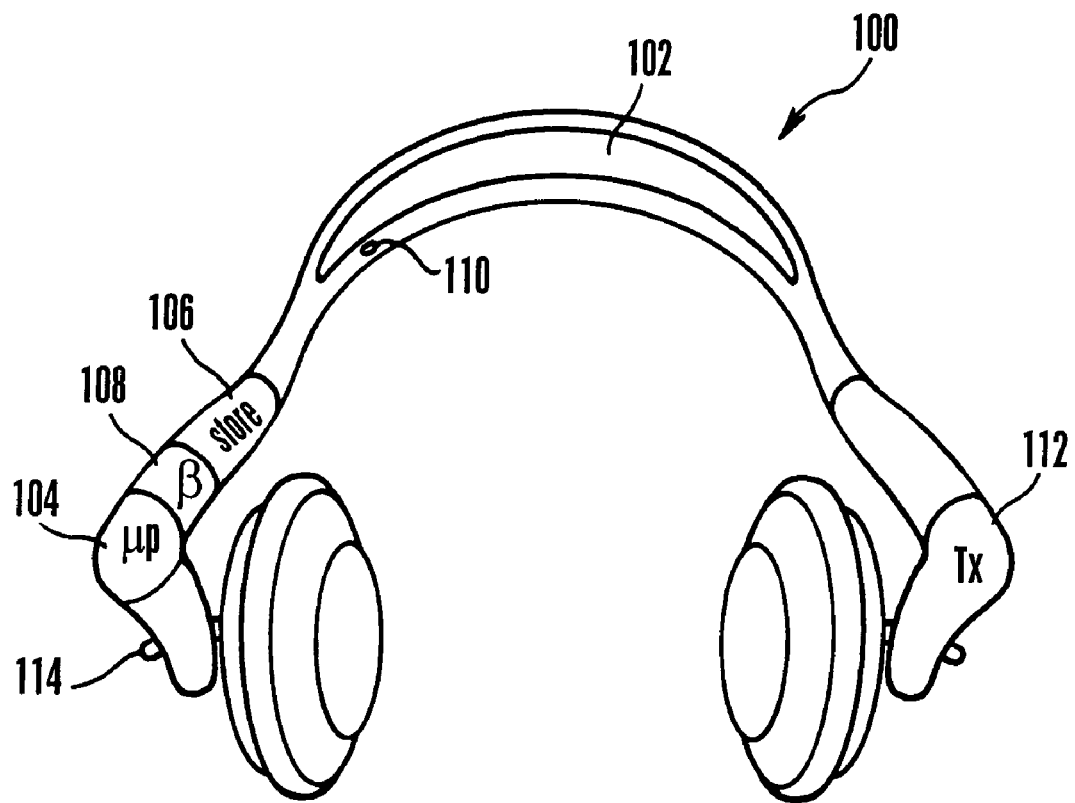
FIG. 4 is a perspective view of an alternate headphone, schematically showing a battery, processor, data store, and wireless transmitter in the headphone for sending the mode signal to the audio device.

Sending a mute command to the audio player 48 when the headphone 12 is removed from the cradle 14 is but one example of how the volume of the player speakers 50 may be controlled in response to a mode or operational change of the present headphone. FIG. 4 shows that in an alternate embodiment, for example, a headphone 100 that in all essential respects may be identical in configuration and operation to the headphone 12 shown in FIGS. 1-3 with the following exceptions may be provided. The headphone 100 shown in FIG. 4 may include a frame 102 bearing a headphone processor 104 communicating with a data store 106 and a battery 108. When the headphone 100 is removed from the cradle 14, a switch 110 on the frame 100 may actuate to signal to the headphone processor 104 that the headphone 100 has been removed from the cradle, and in response the headphone processor 104 can cause a wireless volume control transmitter 112 on the frame 102 to transmit the above-described volume control signal to the audio player 48. Or, in lieu of the switch 110 the transmitter 112 can be actuated by the headphone processor 104 upon reception of a valid IR or RF command signal from the cradle 14 or a valid audio signal originated by the player 48.

Yet another mode or operational change of the headphone 12 that can precipitate the transmission of the volume control signal can be implemented by causing the headphone processor 104 to send the volume control signal upon initial energization when an on-off switch 114 on the headphone 100 is toggled "on" to energize the headphone 100 for use. Then, when the on-off switch 114 is toggled "off", prior to deenergizing the components of the headphone 100 the headphone processor 104 can cause a volume increase signal to be sent from the headphone transmitter 112 to the player 48 to resume audio broadcast from the player speakers 50.

Yet another operational or mode change is the sensing by the headphone processor 104 of interference, in which case the headphone processor 104 can cause the volume control signal to be sent to turn up the volume on the player speakers 50.

While the particular SYSTEM AND METHOD FOR MUTING TV SPEAKERS WHEN HEADPHONES IN USE is herein shown and described in detail, it is to be understood that the subject matter which is encompassed by the present invention is limited only by the claims.

What is claimed is:

1. A headphone system, comprising:
 a charging cradle;
 at least one headphone removably engageable with the charging cradle to charge at least one battery in the headphone, the headphone including left and right speakers which, when placed on the head of a user, are juxtaposed with the user's left and right ears, the headphone communicating with an audio device to receive audio therefrom playable on the headphone; and
 a wireless transmitter configured to send, responsive to a determination that the headphone has been removed from the charging cradle, a wireless signal to the audio device to cause the audio device to lower or mute a volume output by at least one speaker of the audio device without deenergizing the audio device so that the audio device communicates audio to the headphones.

2. The system of claim 1, comprising a switch on the cradle for generating a signal indicating at least one of: headphone engagement with the cradle, or headphone disengagement with the cradle.

3. The system of claim 2, comprising a cradle processor in the cradle, the wireless transmitter configured to receive a signal from the cradle processor to cause the transmitter to send the wireless signal to the audio device to cause the audio device to alter a volume output by at least one speaker of the audio device responsive to a determination by the cradle processor in the recharging cradle that the headphone has been removed from the cradle.

4. The system of claim 3, wherein the transmitter is a radiofrequency transmitter mounted on the cradle.

5. The system of claim 3, wherein the transmitter is an infrared transmitter connectable by a wire to the cradle.

6. The system of claim 1, wherein the transmitter is mounted on the headphone.

7. The system of claim 1, wherein the wireless signal carries at least first and second volume change signals for respective first and second audio devices.

8. A headphone system comprising:
   a headphone including left and right audio speakers configured for placement adjacent the ears of a listener to play an audio stream generated by an audio player distanced, from the headphone;
   a cradle configured for removably receiving the headphone to charge at least one battery of the headphone; and
   at least one wireless transmitter configured to transmit a first volume change signal to the audio player in response to removal of the headphone from the cradle and to transmit a second audio change signal to the audio player in response to engagement of the headphone with the cradle, the first volume change signal causing the audio player to reduce a volume output by a speaker of the audio player, the second volume change signal causing the audio player to increase a volume output by a speaker of the audio player, neither volume change signal causing deenergization of the audio player such that the audio player sends the audio stream to the headphone after receipt of the volume change signal.

9. The system of claim 8, comprising a switch on the cradle for generating a signal indicating at least one of: headphone engagement with the cradle, or headphone disengagement with the cradle.

10. The system of claim 9, comprising a cradle processor in the cradle, the wireless transmitter configured to receive a signal from the cradle processor to cause the transmitter to send the volume change signal to the audio player.

11. The system of claim 10, wherein the transmitter is a radiofrequency transmitter mounted on the cradle.

12. The system of claim 10, wherein the transmitter is an infrared transmitter connectable by a wire to the cradle.

13. The system of claim 8, wherein the transmitter is mounted on the headphone.

14. The system of claim 13, wherein the volume change signal is sent to the audio player in response to switching off of the headphone by a user.

15. The system of claim 8, wherein the volume change signal carries at least first and second volume change signals for respective first and second audio players.

16. A computer readable storage medium storing a program with code to execute logic, the logic executed by the processor in accordance with the code comprising:
   receiving a signal representing a change in energization of a portable wireless headphone; and
   in response to the signal, controlling a transmitter to send to an audio player separate from the portable wireless headphone a command to alter the volume of a speaker of the player without deenergizing the audio player, wherein the command to alter the volume of the speaker causes the audio player to increase or decrease the volume of the speaker by changing the volume to a volume that is different from an original volume output by the speaker prior to transmission of the command to alter the volume of the speaker.

17. The processor of claim 16, wherein the processor is mounted in a headphone cradle or in the headphone.

* * * * *